US009450075B2

(12) United States Patent
Huang

(10) Patent No.: US 9,450,075 B2
(45) Date of Patent: Sep. 20, 2016

(54) SEMICONDUCTOR DEVICE AND MANUFACTURING METHOD THEREOF

(71) Applicant: Semiconductor Manufacturing International (Shanghai) Corporation, Shanghai (CN)

(72) Inventor: Herb He Huang, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/575,967

(22) Filed: Dec. 18, 2014

(65) Prior Publication Data
US 2015/0206936 A1  Jul. 23, 2015

(30) Foreign Application Priority Data
Jan. 23, 2014 (CN) .......................... 2014 1 0032806

(51) Int. Cl.
| H01L 29/10 | (2006.01) |
| H01L 29/66 | (2006.01) |
| H01L 29/78 | (2006.01) |
| H01L 29/786 | (2006.01) |
| H01L 21/265 | (2006.01) |
| H01L 21/768 | (2006.01) |

(52) U.S. Cl.
CPC ....... *H01L 29/66681* (2013.01); *H01L 29/105* (2013.01); *H01L 29/1083* (2013.01); *H01L 29/7824* (2013.01); *H01L 29/78654* (2013.01); *H01L 29/78696* (2013.01); *H01L 21/265* (2013.01); *H01L 21/26506* (2013.01); *H01L 21/76898* (2013.01)

(58) Field of Classification Search
CPC ........... H01L 29/66537; H01L 29/105; H01L 29/1083
See application file for complete search history.

(56) References Cited

U.S. PATENT DOCUMENTS

| 6,005,285 | A * | 12/1999 | Gardner | ............ H01L 21/02381 257/607 |
| 6,482,714 | B1* | 11/2002 | Hieda | ............... H01L 21/28061 257/E21.2 |
| 8,653,604 | B1* | 2/2014 | Hoffmann | ......... H01L 21/28255 257/192 |
| 2005/0250289 | A1* | 11/2005 | Babcock | ........... H01L 21/82285 438/309 |
| 2006/0071278 | A1* | 4/2006 | Takao | ............... H01L 21/82380 257/365 |
| 2009/0134468 | A1* | 5/2009 | Tsuchiya | ................. H01L 21/84 257/368 |
| 2011/0073961 | A1* | 3/2011 | Dennard | ............... H01L 29/105 257/408 |
| 2011/0074498 | A1* | 3/2011 | Thompson | ........ H01L 21/82341 327/543 |
| 2011/0079861 | A1* | 4/2011 | Shifren | ............. H01L 21/82341 257/402 |
| 2011/0169082 | A1* | 7/2011 | Zhu | ........................ H01L 21/187 257/347 |
| 2011/0309450 | A1* | 12/2011 | Shifren | ............. H01L 21/82380 257/369 |
| 2012/0139051 | A1* | 6/2012 | Ranade | ................. H01L 29/105 257/368 |

FOREIGN PATENT DOCUMENTS

TW  DE 102014019380 A1 *  7/2015 ......... H01L 29/1054

* cited by examiner

*Primary Examiner* — Joshua King
(74) *Attorney, Agent, or Firm* — Innovation Counsel LLP

(57) ABSTRACT

A semiconductor device includes a base dielectric layer, a semiconductor substrate layer disposed on the base dielectric layer, and a transistor disposed in the semiconductor substrate layer. The transistor includes a gate dielectric layer disposed on the semiconductor substrate layer, a gate electrode disposed on the gate dielectric layer, source and drain electrodes disposed within the semiconductor substrate layer on opposite sides of the gate electrode, an undoped channel region, a base dopant region, and a threshold voltage setting region. The undoped channel region, base dopant region, and threshold voltage setting region are disposed within the semiconductor substrate layer. The undoped channel region is disposed between the source electrode and the drain electrode, and the base dopant region and the threshold voltage setting region extend beneath the source electrode and the drain electrode. The threshold voltage setting region is disposed between the undoped channel region and the base dopant region.

13 Claims, 8 Drawing Sheets

SEMICONDUCTOR DEVICE AND MANUFACTURING METHOD THEREOF

CROSS-REFERENCE TO RELATED APPLICATION

This application claims priority to Chinese Patent Application No. 201410032806.9 filed on Jan. 23, 2014, the disclosure of which is incorporated herein by reference in its entirety.

BACKGROUND

1. Technical Field

The present disclosure relates to the field of semiconductor technology, and more particularly to a semiconductor device and manufacturing method thereof.

2. Description of the Related Art

In the field of semiconductor technology, there is a need to re-design the conventional field effect transistor (FET) device to improve conductivity of the depletion channel while maintaining or reducing threshold voltage variations and junction leakage in the transistor. The improvements resulting from the redesign include lower power consumption and improved device performance, particularly for radio frequency (RF) front-end module devices on a semiconductor chip. The RF front-end module devices typically have more stringent performance and power amplification requirements since they operate at high frequencies (on the order of GHz).

In a conventional field effect transistor, forming an undoped deep depletion channel under the gate is an effective way to increase conductivity of the depletion channel and channel mobility, and is known to those skilled in the art. In addition, forming a threshold voltage control dopant layer beneath the undoped deep depletion channel is also effective in reducing threshold voltage variations. Furthermore, forming a heavily doped region beneath the threshold voltage control dopant layer can also improve bulk grounding or bias.

However, in a conventional semiconductor manufacturing process, after performing ion implantation to form the heavily doped region and threshold voltage control dopant layer in a silicon substrate, a post-doping epitaxial deposition process is typically carried out to form the undoped deep depletion channel under the gate of the FET.

During epitaxial growth of the undoped deep depletion channel, dopants from the heavily doped region and threshold voltage control dopant layer may diffuse into the undoped deep depletion channel. Therefore, to minimize dopant diffusion, the process temperature and duration of the post-doping epitaxial deposition process has to be strictly controlled (to minimize the thermal budget).

SUMMARY

The present disclosure addresses at least the above challenges in the prior art. Specifically, the present disclosure discloses a semiconductor device having an undoped deep depletion channel in the transistor and a method of manufacturing the same. The semiconductor device according to the inventive concept has reduced overlap capacitance, lower threshold voltage variations, and improved carrier mobility in the depletion channel compared to the prior art.

According to one embodiment of the inventive concept, a semiconductor device is provided. The semiconductor device includes: a base dielectric layer; a semiconductor substrate layer disposed on the base dielectric layer; and a transistor disposed within and on a surface of the semiconductor substrate layer. The transistor includes: a gate dielectric layer disposed on the semiconductor substrate layer; a gate electrode disposed on the gate dielectric layer; a source electrode and a drain electrode disposed within the semiconductor substrate layer on opposite sides of the gate electrode; and an undoped channel region, a base dopant region, and a threshold voltage setting region. The undoped channel region, the base dopant region, and the threshold voltage setting region are disposed within the semiconductor substrate layer. The undoped channel region is disposed between the source electrode and the drain electrode, and the base dopant region and the threshold voltage setting region extend beneath the source electrode and the drain electrode. The undoped channel region is disposed beneath the gate electrode, the base dopant region is disposed below the undoped channel region, and the threshold voltage setting region is disposed between the undoped channel region and the base dopant region.

In one embodiment, each of the base dopant region and the threshold voltage setting region may have a first dopant type, and the source electrode and the drain electrode may have a second dopant type that is opposite in polarity to the first dopant type. A doping concentration of the threshold voltage setting region may be lower than a doping concentration of the base dopant region.

In one embodiment, the doping concentration of the base dopant region may be greater than $5 \times 10^{18}$ atoms/cm$^3$.

In one embodiment, the semiconductor device may further include: a well disposed within the semiconductor substrate layer above the base dielectric layer, wherein the well may have a first dopant type, and the source electrode and the drain electrode may have a second dopant type that is opposite in polarity to the first dopant type. A doping concentration of the well may be lower than a doping concentration of the base dopant region.

In one embodiment, the semiconductor device may further include: a breakdown inhibition zone disposed within the semiconductor substrate layer, wherein the breakdown inhibition zone may have the first dopant type. A doping concentration of the breakdown inhibition zone may be lower than the doping concentration of the base dopant region but higher than the doping concentration of the well.

In one embodiment, the semiconductor substrate layer may be made of single crystal silicon, and the base dielectric layer may be made of silicon oxide.

In one embodiment, a length of the gate electrode may be denoted by Lg, and a distance from the base dopant region to the gate dielectric layer may be greater than or equal to 0.1 Lg, and less than or equal to 2.0 Lg.

In one embodiment, the semiconductor device may further include: a plurality of shallow trench isolation (STI) structures surrounding and insulating the sides of the transistor, and disposed in contact with the base dielectric layer.

In one embodiment, the semiconductor device may further include: an interfacial dopant layer disposed at an interface between the base dielectric layer and the semiconductor substrate layer. The interfacial dopant layer may include at least a polarized dopant and a neutralized dopant.

In one embodiment, the neutralized dopant may be Argon (Ar).

In one embodiment, the threshold voltage setting region may further include a diffusion barrier layer that inhibits dopant diffusion from the threshold voltage setting region and the base dopant region.

In one embodiment, the diffusion barrier layer may include a carbon material for inhibiting dopant diffusion.

In one embodiment, the semiconductor device may further include: at least one interlayer dielectric layer disposed on the semiconductor substrate layer; and at least one interconnect disposed within the one interlayer dielectric layer.

According to another embodiment of the inventive concept, a method of manufacturing a semiconductor device is provided. The method includes: providing a carrier substrate; forming a buffer layer on the carrier substrate, and a semiconductor substrate layer on the buffer layer, wherein the semiconductor substrate layer, buffer layer, and carrier substrate collectively constitute a first semiconductor substrate; forming a plurality of shallow trench isolation (STI) structures within the semiconductor substrate layer, wherein the STI structures are formed in contact with the buffer layer; forming a gate dielectric layer on a first surface of the semiconductor substrate layer, and a gate electrode on the gate dielectric layer; performing ion implantation to form a source electrode and a drain electrode in the semiconductor substrate layer, wherein the source electrode and the drain electrode are disposed on opposite sides of the gate electrode; removing the carrier substrate and the buffer layer; performing ion implantation on a second surface of the semiconductor substrate layer to form a threshold voltage setting region within the semiconductor substrate layer, wherein the threshold voltage setting region extends beneath the source electrode and the drain electrode; performing ion implantation on the second surface of the semiconductor substrate layer to form a base dopant region within the semiconductor substrate layer, wherein the base dopant region extends beneath the source electrode, the drain electrode, and the threshold voltage setting region; and forming a base dielectric layer on the second surface of the semiconductor substrate layer, wherein an undoped channel region is a region within the semiconductor substrate layer that is unaffected by the ion implantation, and the undoped channel region is disposed above the threshold voltage setting region and below the gate electrode, in between the source electrode and the drain electrode.

In one embodiment, each of the base dopant region and the threshold voltage setting region may have a first dopant type, and the source electrode and the drain electrode may have a second dopant type that is opposite in polarity to the first dopant type. A doping concentration of the threshold voltage setting region may be lower than a doping concentration of the base dopant region.

In one embodiment, the doping concentration of the base dopant region may be greater than $5 \times 10^{18}$ atoms/cm$^3$.

In one embodiment, the method may further include: after forming the base dopant region: performing rapid thermal annealing of the semiconductor substrate layer through the second surface of the semiconductor substrate layer, so as to activate the threshold voltage setting region and base dopant region.

In one embodiment, the method may further include: prior to forming the base dielectric layer on the second surface of the semiconductor substrate layer: performing ion implantation on the second surface of the semiconductor substrate layer to form an interfacial dopant layer, wherein the interfacial dopant layer includes at least a polarized dopant and a neutralized dopant.

In one embodiment, the method may further include: forming at least one interlayer dielectric layer on the first surface of the semiconductor substrate layer; forming at least one first interconnect within the interlayer dielectric layer, the first interconnect connecting the gate electrode, the source electrode, and the drain electrode, the first interconnect comprising first vertical interconnects and first horizontal interconnects; and forming a second semiconductor substrate on the first semiconductor substrate.

In one embodiment, the method may further include: forming silicon vias comprising second vertical interconnects extending through the base dielectric layer, the semiconductor substrate layer, and the interlayer dielectric layer; and forming second horizontal interconnects on the bottom surface of the base dielectric layer, wherein the second vertical interconnects are in contact with the first horizontal interconnects and the second horizontal interconnects.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
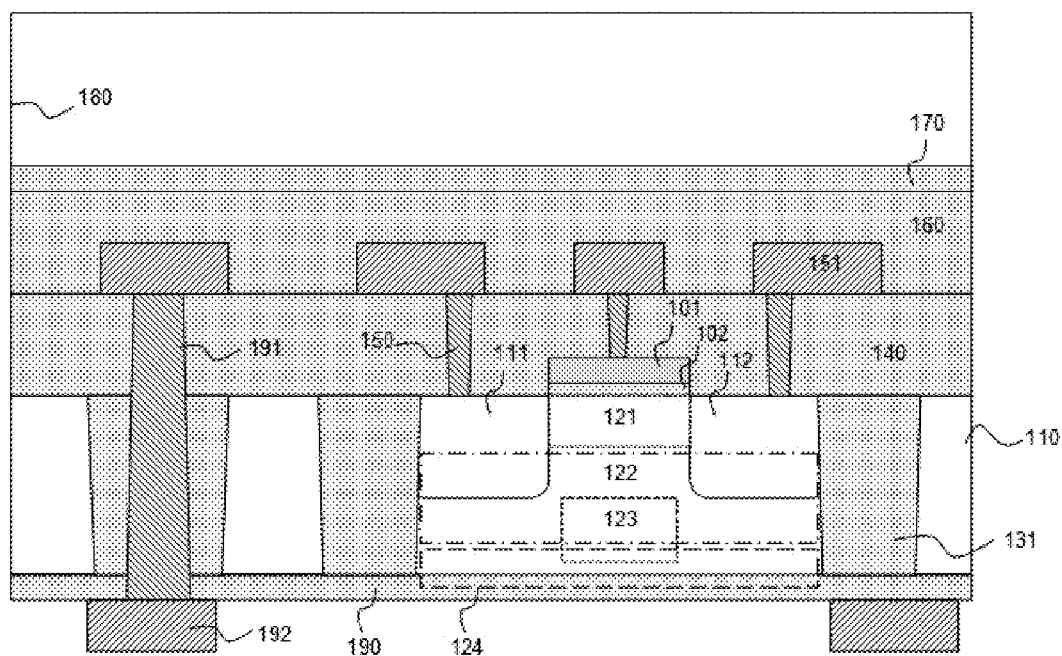
FIG. 1 depicts a schematic cross-sectional view of a semiconductor device according to an embodiment.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

The semiconductor device according to the inventive concept includes a field effect transistor (FET) having an undoped deep depletion channel. The semiconductor device may also include radio frequency (RF) switching devices, RF front-end modules, and other components (for example, other types of transistors, resistors, capacitors, inductors, microelectromechanical systems (MEMS) devices, etc.).

First, the structure of the semiconductor device according to an embodiment is described with reference to FIG. 1. Referring to FIG. 1, the semiconductor device includes a base dielectric layer 190, a semiconductor substrate layer 110 disposed on the base dielectric layer 190, and a transistor (e.g. FET) disposed within and on a surface of the semiconductor substrate layer 110. The transistor includes a gate dielectric layer 102 disposed on the semiconductor substrate layer 110, a gate electrode 101 disposed on the gate dielectric layer 102, and a source electrode 111 and a drain electrode 112 disposed within the semiconductor substrate layer 110 on opposite sides of the gate electrode 101.

The transistor also includes an undoped channel region 121 disposed within the semiconductor substrate layer 110. Specifically, the undoped channel region 121 is disposed beneath the gate dielectric layer 102 and extends between the source electrode 111 and the drain electrode 112.

The transistor further includes a base dopant region 123 disposed within the semiconductor substrate layer 110. Specifically, the base dopant region 123 is disposed above the base dielectric layer 190 and extends beneath the source electrode 111 and the drain electrode 112.

In one embodiment, the base dopant region 123 is formed having a depletion depth. The base dopant region 123 having the depletion depth, together with the undoped channel region 121, collectively constitutes an undoped deep depletion channel.

The transistor further includes a threshold voltage setting region 122 disposed within the semiconductor substrate layer 110. Specifically, the threshold voltage setting region 122 is disposed between the undoped channel region 121 and the base dopant region 123, and extends beneath the source electrode 111 and the drain electrode 112.

The base dopant region 123 has a dopant type that is opposite in polarity to the dopant type for the source electrode 111 and the drain electrode 112. In one embodiment, the doping concentration of the base dopant region 123 is greater than $5 \times 10^{18}$ atoms/cm$^3$. The threshold voltage setting region 122 also has a dopant type that is opposite in polarity to the dopant type for the source electrode 111 and the drain electrode 112. The doping concentration of the threshold voltage setting region 122 is lower than the doping concentration of the base dopant region 123.

In one embodiment, the semiconductor device further includes a well disposed within the semiconductor substrate layer 110. The well is disposed above the base dielectric layer 190. The well has a dopant type that is opposite in polarity to the dopant type for the source electrode 111 and the drain electrode 112. The doping concentration of the well is lower than the doping concentration of the base dopant region 123.

In one embodiment, the semiconductor device further includes a breakdown inhibition zone (punch through suppression region) disposed within the semiconductor substrate layer 110. The breakdown inhibition zone has a dopant type that is opposite in polarity to the dopant type for the source electrode 111 and the drain electrode 112. The doping concentration of the breakdown inhibition zone is lower than the doping concentration of the base dopant region 123 but higher than the doping concentration of the well.

In one embodiment, the semiconductor substrate layer 110 is made of single crystal silicon, and the base dielectric layer 190 is made of silicon oxide.

In one embodiment, a length of the gate electrode 101 is denoted by Lg, and a distance from the base dopant region 123 to the gate dielectric layer 102 is $\geq 0.1$ Lg and $\leq 2.0$ Lg.

In one embodiment, the base dopant region 123 is formed having a depletion depth. The base dopant region 123 having the depletion depth, together with the undoped channel region 121, collectively constitutes an undoped deep depletion channel.

In one embodiment, the semiconductor device further includes a plurality of shallow trench isolation (STI) structures 131 surrounding and insulating the sides of the transistor, and disposed in contact with the base dielectric layer 190 (as shown in FIG. 1). The STI structures 131 are made of an insulating material. For example, the STI structures 131 may include silicon oxide.

In one embodiment, the semiconductor device may further include an interfacial dopant layer 124 disposed at an interface between the base dielectric layer 190 and the semiconductor substrate layer 110. The interfacial dopant layer 124 includes at least a polarized dopant and a neutralized dopant. In one embodiment, the neutralized dopant may be Argon (Ar).

In one embodiment, the threshold voltage setting region 122 includes a diffusion barrier layer that suppresses dopant diffusion from the threshold voltage setting region 122 and the base dopant region 123. The diffusion barrier layer includes a material that inhibits dopant diffusion. In one embodiment, carbon is used as the material for inhibiting dopant diffusion.

In one embodiment (see FIG. 1), the semiconductor device may further include interlayer dielectric layers 140 and 160 disposed on the semiconductor substrate layer 110, first vertical interconnects 150 disposed within the interlayer dielectric layer 140, first horizontal interconnects 151 disposed within the interlayer dielectric layer 160, an adhesive layer 170 disposed on the interlayer dielectric layer 160, a second semiconductor substrate 180 disposed on the adhesive layer 170, silicon vias containing second vertical interconnects 191 extending through the interlayer dielectric layer 140, semiconductor substrate layer 110, and base dielectric layer 190, and second horizontal interconnects 192 disposed on a surface of the base dielectric layer 190. It should be noted that the exemplary semiconductor device is not limited to the above structure, and may include other components and different structural configurations.

In the exemplary semiconductor device, the channel of the transistor includes the undoped channel region 121, base dopant region 123, and threshold voltage setting region 122. Accordingly, overlap capacitance and threshold voltage variations can be reduced, and channel mobility can be improved, thus improving the performance of the semiconductor device.

Figure 2A:
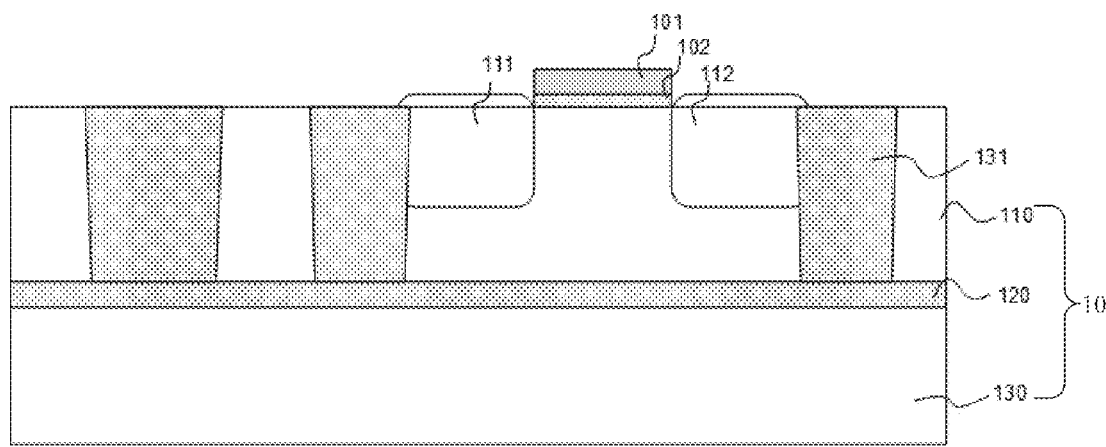
FIGS. 2A, 2B, 2C, 2D, 2E, and 2F depict different cross-sectional views of the semiconductor device of FIG. 1 at different stages of manufacture.
Figure 2B:
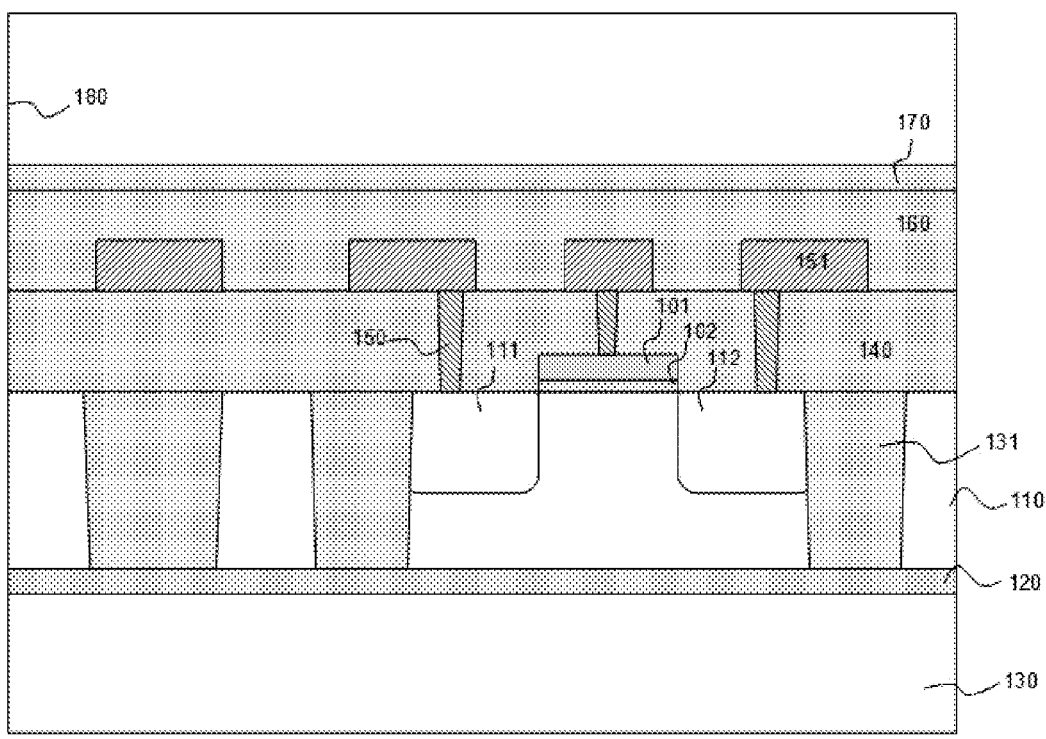
Figure 2C:
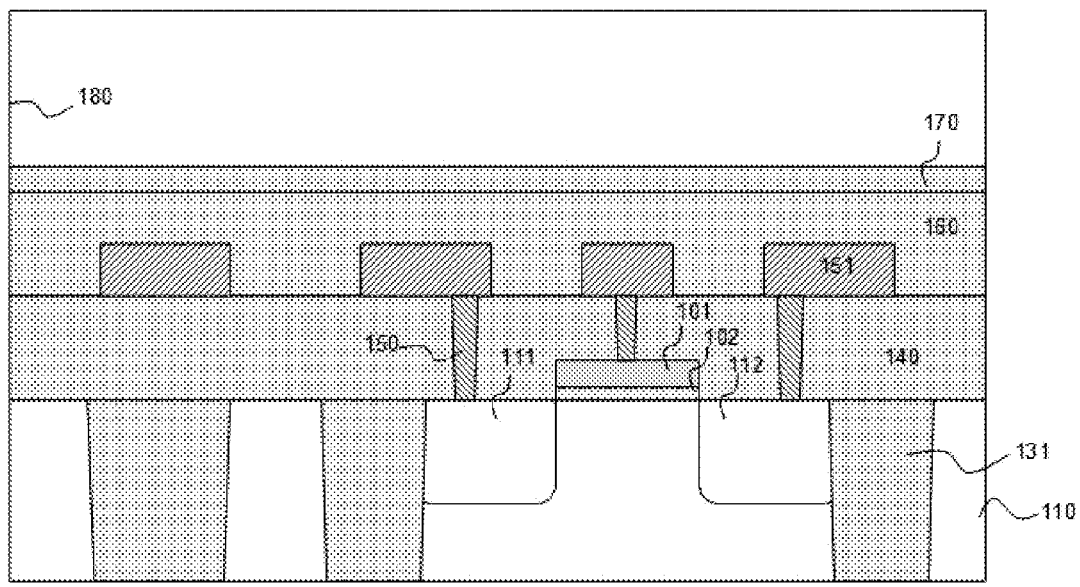
Figure 2D:
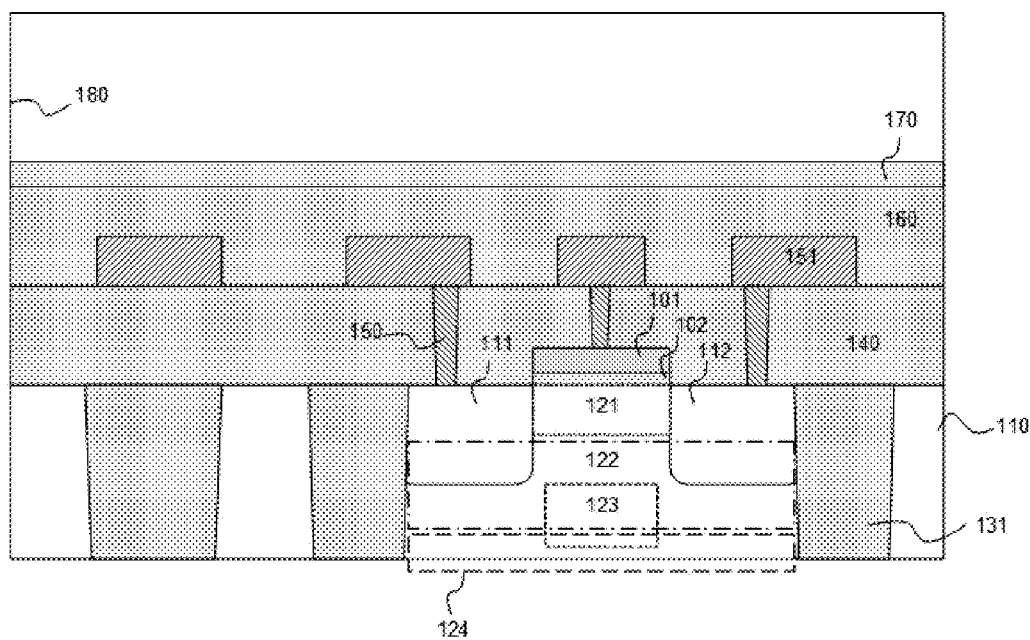
Figure 2E:
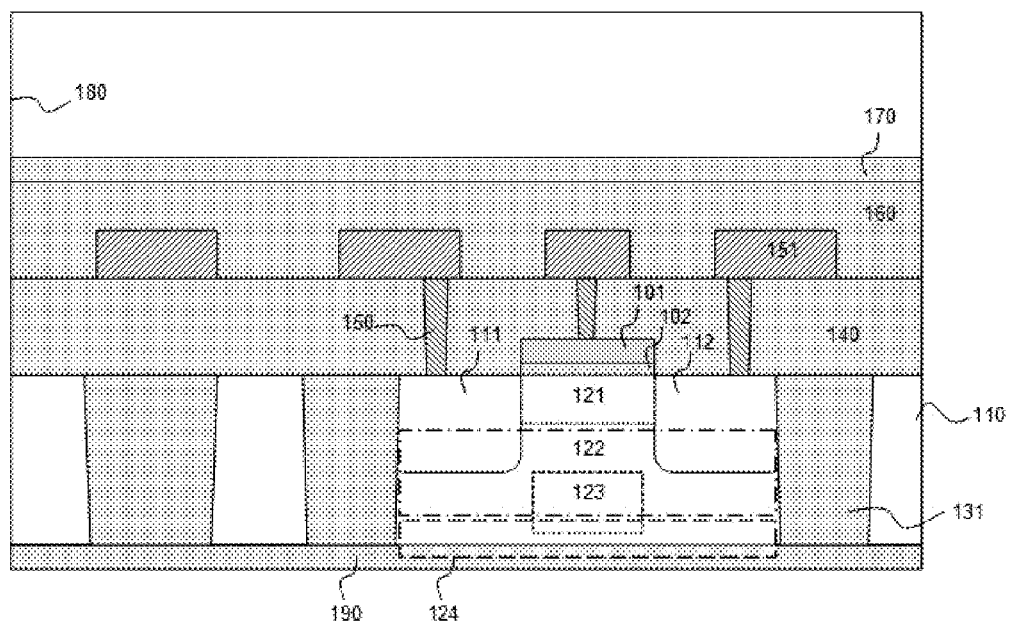
Figure 2F:
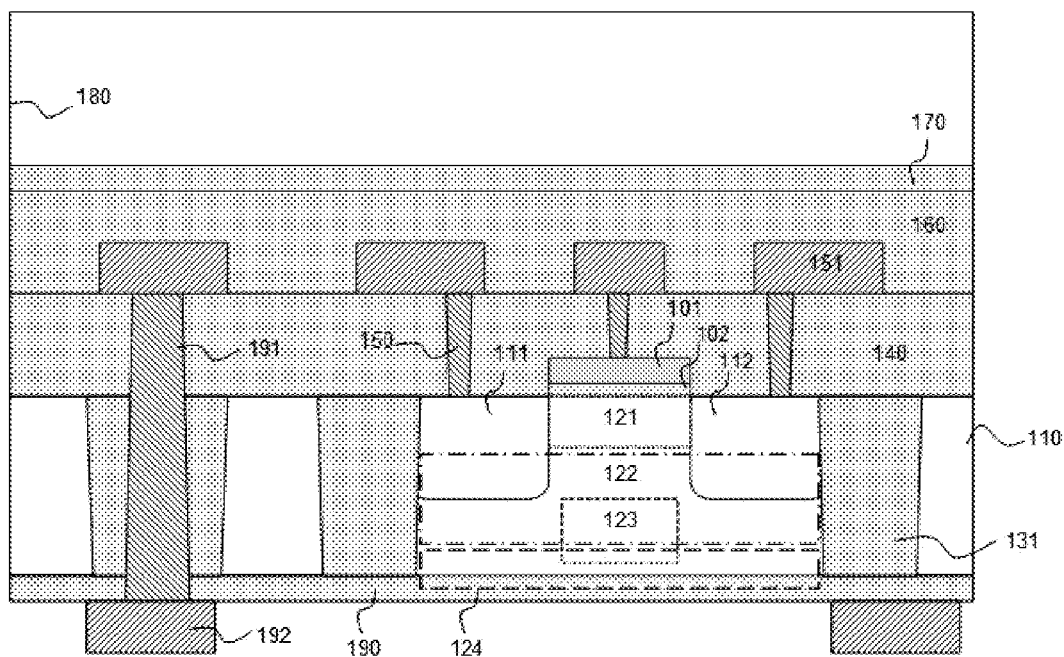
Figure 3:
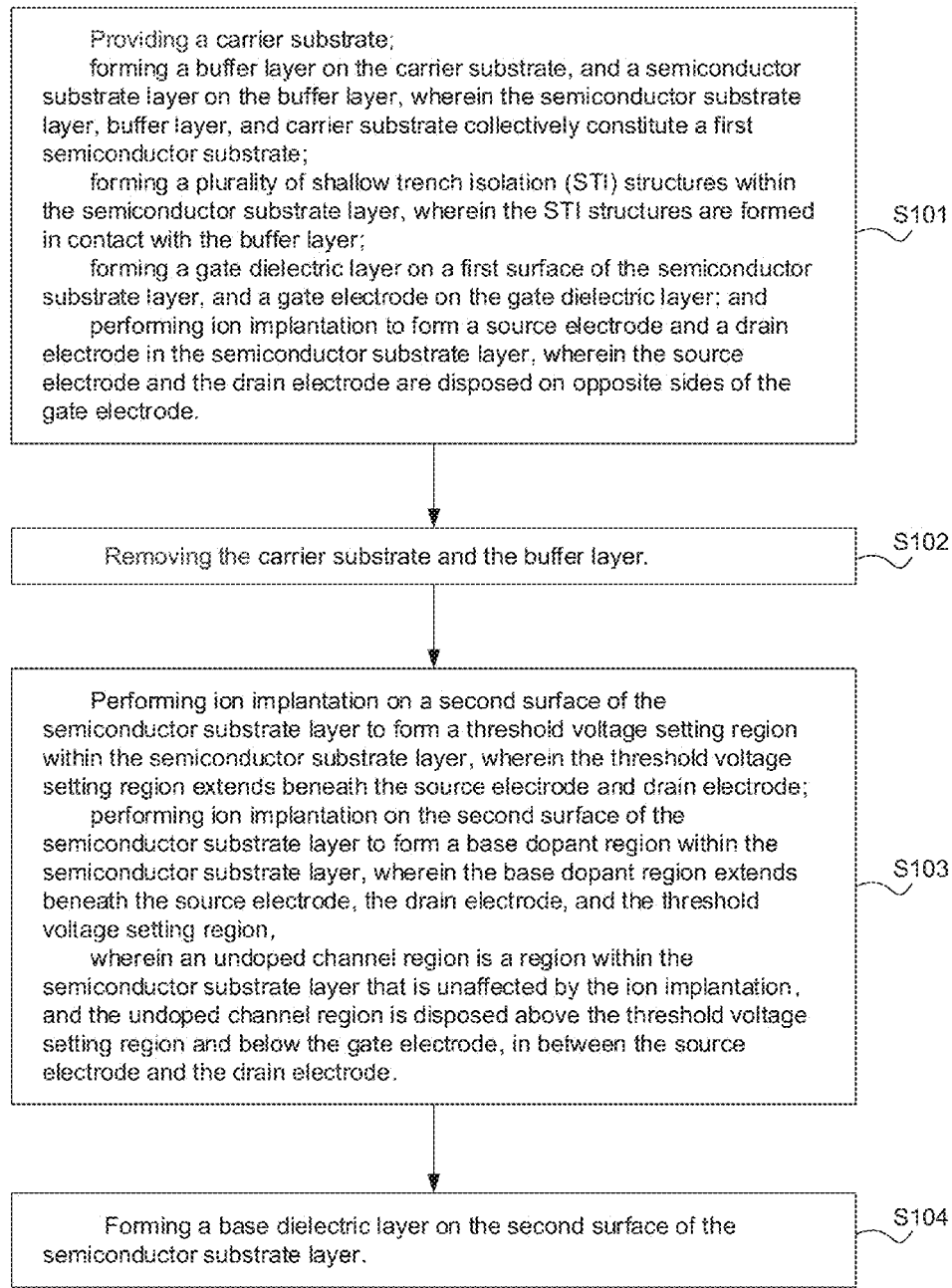
FIG. 3 is a flowchart illustrating a method of manufacturing the semiconductor device of FIG. 1 according to an embodiment.

Next, a method of manufacturing a semiconductor device according to an embodiment will be described in detail with reference to FIGS. 2A though 2F and FIG. 3. Specifically, FIGS. 2A, 2B, 2C, 2D, 2E, and 2F depict different cross-sectional views of the semiconductor device of FIG. 1 at different stages of manufacture. FIG. 3 is a flowchart illustrating a method of manufacturing the semiconductor device of FIG. 1 according to an embodiment. The method includes the following steps:

In Step S101, a carrier substrate 130 is provided. A buffer layer 120 is formed on the carrier substrate 130, and a semiconductor substrate layer 110 is formed on the buffer layer 120. The semiconductor substrate layer 110, buffer layer 120, and carrier substrate 130 collectively constitute a first semiconductor substrate 10. A plurality of shallow trench isolation (STI) structures 131 are formed within the semiconductor substrate layer 110, the STI structures 131 in contact with the buffer layer 120. A gate dielectric layer 102 is formed on a first surface of the semiconductor substrate layer 110. A gate electrode 101 is formed on the gate dielectric layer 102. Ion implantation is performed to form a source electrode 111 and a drain electrode 112 in the semiconductor substrate layer 110. The source electrode 111 and drain electrode 112 are disposed on opposite sides of the gate electrode 101. The resulting structure is illustrated in FIG. 2A.

In the exemplary embodiment, a transistor comprises the gate dielectric layer 102, gate electrode 101, source electrode 111, and drain electrode 112. As shown in FIG. 2A, the transistor is disposed between adjacent STI structures 131.

The STI structures 131 are disposed above the buffer layer 120 and extend through the semiconductor substrate layer 110 to the buffer layer 120. As such, the STI structures 131 are in contact with the buffer layer 120.

The STI structures 131, gate dielectric layer 102, and gate electrode 101 may be formed using various techniques known to those skilled in the art. The source electrode 111 and drain electrode 112 may also be formed using methods other than ion implantation. In addition, other components (such as wells, sidewalls spacers on the gate electrode, etc.) may be formed in Step S101.

Next, an interlayer dielectric layer 140 is formed on the first surface of the semiconductor substrate layer 110. First vertical interconnects 150 are formed within the interlayer dielectric layer 140, and first horizontal interconnects 151 are formed on a surface of the interlayer dielectric layer 140. Another interlayer dielectric layer 160 is formed on the interlayer dielectric layer 140. The first vertical interconnects 150 and first horizontal interconnects 151 are connected to the gate electrode 101, source electrode 111, and drain electrode 112 of the transistor.

It should be noted that the interlayer dielectric layers 140 and 160, first vertical interconnects 150, and first horizontal interconnects 151 are merely illustrative, and that the inventive concept may be modified in various ways. For example, other embodiments may include any number of interlayer dielectric layers and vertical/horizontal interconnects.

An adhesive layer 170 is formed on the interlayer dielectric layer 160, and a second semiconductor substrate 180 is formed on the adhesive layer 170. The second semiconductor substrate 180 is disposed on the first semiconductor substrate 10. The resulting structure is illustrated in FIG. 2B.

In Step S102, the carrier substrate 130 and buffer layer 120 are removed. The carrier substrate 130 and buffer layer 120 may be removed using etching, peeling, or any other suitable techniques. The resulting structure is illustrated in FIG. 2C.

In Step S103, ion implantation is performed on a second surface of the semiconductor substrate layer 110 to form a threshold voltage setting region 122. The first and second surfaces of the semiconductor substrate layer 110 are opposite to each other. The threshold voltage setting region 122 is formed within the semiconductor substrate layer 110 and extends beneath the source electrode 111 and drain electrode 112. An undoped channel region 121 is a region within the semiconductor substrate layer 110 that is unaffected by the ion implantation. As shown in FIG. 2D, the undoped channel region 121 is disposed above the threshold voltage setting region 122 and below the gate electrode 101, in between the source electrode 111 and the drain electrode 112.

Ion implantation is also performed on the second surface of the semiconductor substrate layer 110 to form a base dopant region 123. The base dopant region 123 is formed within the semiconductor substrate layer 110 and extends beneath the source electrode 111, drain electrode 112, and threshold voltage setting region 122.

The base dopant region 123 has a dopant type that is opposite in polarity to the dopant type for the source electrode 111 and the drain electrode 112. In one embodiment, the doping concentration of the base dopant region 123 is greater than $5\times10^{18}$ atoms/cm$^3$. The threshold voltage setting region 122 also has a dopant type that is opposite in polarity to the dopant type for the source electrode 111 and the drain electrode 112. The doping concentration of the threshold voltage setting region 122 is lower than the doping concentration of the base dopant region 123.

In one embodiment, after the base dopant region 123 has been formed, rapid thermal annealing of the semiconductor substrate layer 110 is carried out through the second surface of the semiconductor substrate layer 110, so as to activate the threshold voltage setting region 122 and base dopant region 123.

In one embodiment, ion implantation is performed on the second surface of the semiconductor substrate layer 110 to form an interfacial dopant layer 124. The interfacial dopant layer 124 includes at least a polarized dopant and a neutralized dopant. In one embodiment, the neutralized dopant may be Argon (Ar). The resulting structure is illustrated in FIG. 2D.

In one embodiment, the base dopant region 123 is formed having a depletion depth. The base dopant region 123 having the depletion depth, together with the undoped channel region 121, collectively constitutes an undoped deep depletion channel.

Accordingly, in the above embodiments, a post-doping epitaxial deposition process is no longer needed to form the undoped deep depletion channel under the gate of the FET. As a result, the risk of dopants diffusing from the base region 123 (having a high doping concentration) and threshold voltage setting region 122 (doped layer for threshold voltage control) diffusing into the undoped deep depletion channel during epitaxial growth is greatly reduced. As previously mentioned in the Background section, to minimize diffusion, the process temperatures and time of a post-doping epitaxial deposition process has to be strictly controlled (to minimize the thermal budget). Since the embodiments of the inventive concept need not require a post-doping epitaxial deposition process, the process for forming the semiconductor device is further simplified.

In Step S104, a base dielectric layer 190 is formed on the second surface of the semiconductor substrate layer 110. The base dielectric layer 190 is formed in contact with the STI structures 131. The base dielectric layer 190 may be formed using deposition, bonding, or any other appropriate methods. The resulting structure is illustrated in FIG. 2E.

Next, silicon vias containing second vertical interconnects 191 are formed extending through the base dielectric layer 190, semiconductor substrate layer 110, and interlayer dielectric layer 140. Second horizontal interconnects 192 are formed on the bottom surface of the base dielectric layer 190 in contact with the second vertical interconnects 191. The second vertical interconnects 191 are also formed in contact with the first horizontal interconnects 151. The resulting structure is illustrated in FIG. 2F.

A method of manufacturing a semiconductor device has been described above in Steps S101 through S104. However, the inventive concept is not limited to the above and may include additional semiconductor processing steps known to those skilled in the art.

In the semiconductor device formed using the exemplary method, the channel of the transistor includes the undoped channel region 121, base dopant region 123, and threshold voltage setting region 122. Accordingly, overlap capacitance and threshold voltage variations can be reduced, and channel mobility can be improved, thus improving the performance of the semiconductor device.

Embodiments of a semiconductor device and a method of manufacturing the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A semiconductor device comprising:
    a base dielectric layer;
    a semiconductor substrate layer disposed on the base dielectric layer;
    an interfacial dopant layer disposed at an interface between the base dielectric layer and the semiconductor substrate layer without performing a post-doping epitaxial deposition process, and continuously extending between adjacent shallow trench isolation (STI) structures; and
    a transistor disposed within and on a surface of the semiconductor substrate layer, wherein the transistor comprises:
        a gate dielectric layer disposed on the semiconductor substrate layer;
        a gate electrode disposed on the gate dielectric layer;
        a source electrode and a drain electrode disposed within the semiconductor substrate layer on opposite sides of the gate electrode; and
        an undoped channel region, a base dopant region, and a threshold voltage setting region, wherein the undoped channel region, the base dopant region, and the threshold voltage setting region are disposed within the semiconductor substrate layer,
    wherein the undoped channel region is disposed between the source electrode and the drain electrode, and the base dopant region and the threshold voltage setting region extend beneath the source electrode and the drain electrode, and
    wherein the undoped channel region is disposed beneath the gate electrode, the base dopant region is disposed below the undoped channel region, and the threshold voltage setting region is disposed between the undoped channel region and the base dopant region.

2. The semiconductor device according to claim 1, wherein each of the base dopant region and the threshold voltage setting region has a first dopant type, and the source electrode and the drain electrode have a second dopant type that is opposite in polarity to the first dopant type, and
    a doping concentration of the threshold voltage setting region is lower than a doping concentration of the base dopant region.

3. The semiconductor device according to claim 2, wherein the doping concentration of the base dopant region is greater than $5\times10^{18}$ atoms/cm$^3$.

4. The semiconductor device according to claim 1, further comprising:
a well disposed within the semiconductor substrate layer above the base dielectric layer, wherein the well has a first dopant type, and the source electrode and the drain electrode have a second dopant type that is opposite in polarity to the first dopant type, and a doping concentration of the well is lower than a doping concentration of the base dopant region.

5. The semiconductor device according to claim 4, further comprising:
a breakdown inhibition zone disposed within the semiconductor substrate layer, wherein the breakdown inhibition zone has the first dopant type, and a doping concentration of the breakdown inhibition zone is lower than the doping concentration of the base dopant region but higher than the doping concentration of the well.

6. The semiconductor device according to claim 1, wherein the semiconductor substrate layer is made of single crystal silicon, and the base dielectric layer is made of silicon oxide.

7. The semiconductor device according to claim 1, wherein a length of the gate electrode is denoted by Lg, and a distance from the base dopant region to the gate dielectric layer is greater than or equal to 0.1 Lg, and less than or equal to 2.0 Lg.

8. The semiconductor device according to claim 1, wherein the adjacent STI structures surround and insulate sides of the transistor, and are in contact with the base dielectric layer.

9. The semiconductor device according to claim 1, wherein the interfacial dopant layer includes at least a polarized dopant and a neutralized dopant.

10. The semiconductor device according to claim 9, wherein the neutralized dopant is Argon (Ar).

11. The semiconductor device according to claim 1, wherein the threshold voltage setting region further includes a diffusion barrier layer that inhibits dopant diffusion from the threshold voltage setting region and the base dopant region.

12. The semiconductor device according to claim 11, wherein the diffusion barrier layer includes a carbon material for inhibiting dopant diffusion.

13. The semiconductor device according to claim 1, further comprising:
at least one interlayer dielectric layer disposed on the semiconductor substrate layer; and
at least one interconnect disposed within the one interlayer dielectric layer.

* * * * *